US009523576B2

United States Patent
Bellusci et al.

(10) Patent No.: US 9,523,576 B2
(45) Date of Patent: Dec. 20, 2016

(54) SYSTEM AND METHOD FOR MAGNETIC FIELD DATA COMPRESSION

(71) Applicants: Giovanni Bellusci, Hengelo (NL); Pieter Laurens Slot, Enschede (NL); Hendrik Johannes Luinge, Enshede (NL)

(72) Inventors: Giovanni Bellusci, Hengelo (NL); Pieter Laurens Slot, Enschede (NL); Hendrik Johannes Luinge, Enshede (NL)

(73) Assignee: XSENS HOLDING B.V., Enschede (NL)

(*) Notice: Subject to any disclaimer, the term of this patent is extended or adjusted under 35 U.S.C. 154(b) by 612 days.

(21) Appl. No.: 13/621,560

(22) Filed: Sep. 17, 2012

(65) Prior Publication Data
US 2014/0081592 A1  Mar. 20, 2014

(51) Int. Cl.
G01C 17/02 (2006.01)
G01P 15/00 (2006.01)
(Continued)

(52) U.S. Cl.
CPC .............. G01C 17/02 (2013.01); G01C 17/38 (2013.01); G01P 3/00 (2013.01); G01P 15/00 (2013.01);
(Continued)

(58) Field of Classification Search
CPC . G01R 33/0023; G01R 33/0064; G01C 17/38; G01C 17/02; G01P 3/00
(Continued)

(56) References Cited

U.S. PATENT DOCUMENTS 5,016,009 A * 5/1991 Whiting .................. G06T 9/005
341/106
5,836,982 A * 11/1998 Muhlenberg et al. ............ 607/9
(Continued)

FOREIGN PATENT DOCUMENTS

WO  WO 2006/041891  4/2006
WO  WO 2008/088145  7/2008

OTHER PUBLICATIONS

Nara et al., A Closed-Form Formula for Magnetic Dipole Localization by Measurement of Its Magnetic Field and Spatial Gradients, Oct. 2006, IEEE, 0018-9464, 3291-3293.*
(Continued)

Primary Examiner — John Breene
Assistant Examiner — Mohammad Islam
(74) Attorney, Agent, or Firm — Miller, Matthias & Hull LLP

(57) ABSTRACT

A technique for calculating magnetic field information from a magnetic sensor employs a sensing unit containing the magnetic sensor and another sensor capable of providing a measure of change in orientation. The method includes sampling a magnetic field at points in time and sampling the other sensor at each point in time. The method then entails rotating to a common time instant the magnetic field samples using the orientation of the sensing unit estimated by means of the other sensing modality in order to eliminate variations between magnetic samples due to changes in orientation of the sensor unit within such time interval. The magnetic samples, corrected for the sensor rotation in such interval, are used to calculate magnetic field related information specific to the given time interval and the magnetic field related information is communicated to a receiver at a rate lower than the sample rate.

12 Claims, 3 Drawing Sheets

(51) Int. Cl.
*G01P 3/00* (2006.01)
*G01C 17/38* (2006.01)
*G01R 33/00* (2006.01)
*H03M 7/30* (2006.01)

(52) U.S. Cl.
CPC ....... *G01R 33/0023* (2013.01); *G01R 33/0064* (2013.01); *H03M 7/3062* (2013.01)

(58) Field of Classification Search
USPC ........................................................ 702/141
See application file for complete search history.

(56) References Cited

U.S. PATENT DOCUMENTS

| 7,587,277 | B1* | 9/2009 | Wells | ............................ 701/510 |
| 2001/0029430 | A1* | 10/2001 | Tamura | ................ G01C 21/367 701/469 |
| 2004/0017192 | A1* | 1/2004 | Clymer | .............. G01R 33/0206 324/247 |
| 2005/0264429 | A1 | 12/2005 | Hermary et al. | |
| 2007/0084070 | A1* | 4/2007 | Honkura | ................. G01C 17/38 33/356 |
| 2008/0240583 | A1* | 10/2008 | Jones | ............................ 382/232 |
| 2009/0192751 | A1 | 7/2009 | Kamath et al. | |
| 2009/0326851 | A1* | 12/2009 | Tanenhaus | ............. G01C 21/16 702/96 |
| 2010/0307016 | A1* | 12/2010 | Mayor | ................... G01C 17/38 33/356 |
| 2011/0101964 | A1* | 5/2011 | Ausserlechner | ....... G01D 5/145 324/207.11 |
| 2012/0259572 | A1* | 10/2012 | Afzal et al. | ...................... 702/92 |
| 2013/0006573 | A1* | 1/2013 | Brunner et al. | .............. 702/141 |
| 2013/0060470 | A1* | 3/2013 | Handa | .................... G01C 17/38 702/2 |
| 2013/0110450 | A1* | 5/2013 | Kulik | ............................ 702/141 |
| 2013/0158928 | A1* | 6/2013 | Hogdal | ........................ 702/104 |

OTHER PUBLICATIONS

Search Report from related European Application No. EP 09175290.7; reported dated Dec. 29, 2009.

Swiss Transport Research Conference; "Calculation of Displacements of Measured Accelerations, Analysis of two Accelerometers and Application in road Engineering"; Martin Arraigada, Empa road Engineering/Sealing Comp.; Manfred Partl, Empa Road Engineering/Sealing Comp.; Conference Paper STRC 2006.

"Attitude Estimation by Compensating Gravity Direction" Lekskulchai Pongsak, et al. Department of Mechano-Informatics, The University of Tokyo 7-3-1 Hongo Bunkyo-ku, Tokyo 113-8656 Japan Nomura Research Institute CREST Program, Japan Science and Technology Corporation, 2003.

European Search Report issued on Sep. 8, 2013 for corresponding Application No. 13161077.6.

"A Closed-Form Formula for Magnetic Dipole Localization by Measurement of Its Magnetic Field and Spatial Gradients" Graduate School of Information Science and Technology , The University of Tokyo, Tokyo 113-8656, Japan Sony Ericsson Mobile Communications Japan, Inc., Tokyo 108-0075, Japan, Oct. 2006.

* cited by examiner

SYSTEM AND METHOD FOR MAGNETIC FIELD DATA COMPRESSION

TECHNICAL FIELD OF THE DISCLOSURE

The present disclosure relates to a system and method for calculating magnetic field related information from a set of high-rate magnetometer samples collected within a given time interval. Such magnetic field information can be transmitted to a receiver application processor at a rate lower than the original sample rate, minimizing the data communication requirements when magnetometers are used for example in orientation, position tracking, or SLAM applications.

BACKGROUND OF THE DISCLOSURE

A common use of magnetometers is in combination with an inertial based measurement unit (IMU). The magnetic field is generally used to improve the position and orientation detection, especially with respect to the heading component, which would otherwise suffer from unbounded drift resulting from the integration of angular velocity in orientation. The use of an external magnetic field as a reference can serve to limit or eliminate this drift.

Another use of magnetometers is in position tracking or simultaneous localization and mapping ("SLAM") applications. In this type of usage, the magnetic field is either used to localize the position and/or orientation in space of the magnetometer, given the known characteristics of a generated field (e.g., from a coil placed in a known position), and/or to build a map of the environment, exploiting the "signature" of the magnetic disturbance in such environment to identify a current position and orientation.

In applications such as those mentioned above and others, the magnetometer generally aims to capture the essence of the local magnetic field. This information is often combined with other information sources in tracking algorithms to compute the position and orientation of the device hosting the magnetometer. These tracking algorithms attempt to model the characteristics of the magnetic field variation; the magnetic field in a certain space may depend on the local environment, and may fluctuate with time because of moving objects. Moreover, magnetic disturbances may be caused by the movement of the device on which the magnetometer is integrated, and there may be varying degrees of noise and stability of the magnetic component itself, etc. Additionally, when the magnetometer is integrated with other circuitry or different electronic components, as common in consumer electronics devices (for example smart-phones, tablets, etc.), some amount of magnetic interference is typically present, caused by e.g. inductors, currents from the main power supply tracks, etc.

Currently in such systems, the magnetometer is directly sampled at the desired output data rate (ODR). This approach typically provides satisfactory performance when the ODR is in the order of 100 Hz or higher. However, in the case of low communication rates between the IMU and the Application Processor (AP) side of the device to conserve system resources, or in the presence of rapidly changing magnetic fields, a single magnetic field update may not be sufficient to accurately describe the magnetic field, resulting in loss of useful information. On the other hand, there are applications for which much lower or non-constant ODR are desired or required.

For example, in wireless inertial sensor applications, the use of the wireless link needs to be minimized. In such cases, data rates from a few tens of Hz down to Hz are desired, depending on the application and number of overall sensors wirelessly connected. Similarly, in first responder applications, the data-link might be unreliable. Failures in data reception can result in coarser or variable time resolution between measurement updates (this is a general problem for wireless inertial sensor applications as well).

In a similar way, pedestrian navigation or background activity monitoring benefit from lower ODR to the Application Processor. Here the application might desire data at rates down to a fraction of a Hz to conserve system resources. Another type of application wherein low and variable ODR may be desired are the on-demand driven applications. With respect to such applications, the magnetometer might send data only after a request from the AP side of the device. The ODR in this case is effectively variable and can be as low as a fraction of a Hz.

In addition to the foregoing, a general motivation to the inventors to enable accurate sensor fusion, tracking, and SLAM applications with minimal update rate, is to reduce and relax the overall system requirements. This is of special relevance in general consumer electronics applications since low update rates result in fewer interrupts and lessened contention of communication line and shared bus, allowing for much more flexible and scalable system integration and robust performance. Moreover, low update rates lead to decreased computational demands, since computationally costly fusion algorithms can run at much lower, user selectable, or application driven rates, while the goal is to preserve the same accuracy that could be achieved when processing at high ODRs. This enables a low power motion processing architecture.

For accelerometers and gyroscopes sensors, routinely used in IMU systems, the problem of low ODR may be solved with the use of well-known Strap-Down Integration (SDI) algorithms. In these schemes, angular velocity and acceleration are optimally integrated into rotation and velocity increments, which can be streamed at lower or variable rate without any loss of accuracy as e.g. disclosed by the authors in the applications: U.S. Ser. No. 13/431,570 and U.S. Ser. No. 13/431,584. However, no system to optimally compress and "pack" together relevant information from magnetometers yet exists.

The present disclosure is directed to systems and methods that address one or more of the problems set forth above. However, it should be appreciated that the solution of any particular problem is not a limitation on the scope of this disclosure or of the attached claims except to the extent expressly noted. Additionally, the inclusion of any problem or solution in this Background section is not an indication that the problem or solution represents known prior art except as otherwise expressly noted.

SUMMARY OF THE DISCLOSURE

In accordance with one aspect of the present disclosure, a method is provided for calculating values based on magnetic field information from a magnetic sensor in a sensing unit containing the magnetic sensor and at least one other sensing modality capable of providing a direct or derivative measure of change in orientation. The method includes sampling a magnetic field via the magnetic sensor at a plurality of points in time at a sample rate and sampling the at least one other sensing modality capable of providing a direct or derivative measure of change in orientation of the sensor unit at each of the plurality of points in time.

The method then entails rotating to a common time instant one or more of the plurality of magnetic field samples collected within a time interval using the orientation of the sensing unit at each of the plurality of points in time, estimated by means of the other sensing modality, in order to produce a magnetic samples set that eliminates variations between magnetic samples due to changes in orientation of the sensor unit within such time interval. The magnetic samples corrected for the sensor rotation in such interval, are used to calculate magnetic field related information specific to the given time interval and the magnetic field related information is communicated to a receiver at a rate lower than the sample rate.

In an embodiment, the other sensing modality is a gyroscope device.

The magnetic field related information may be represented by one of an average of the magnetic samples in the time interval and an average of a subset of said magnetic samples. Alternatively, the magnetic field related information may be represented by a measure of the homogeneity of the magnetic field in the time interval, calculated from the variation of the magnetic samples. In an embodiment, the magnetic field related information is represented by a subset of said magnetic samples.

When the magnetometer sensor and the other sensing modality are sampled at disjoint and accurately time-stamped set of points in time, a change in rotation may be estimated from the other sensing modality and used to synchronize the magnetometer samples to the same time points as the other sensing modality.

In another embodiment, the other sensing modality is the combination of a gyroscope and an accelerometer device, possibly integrated in an inertial measurement unit. The magnetic field related information may be represented by the spatial derivatives of the magnetic field in the time interval, evaluated from the magnetic samples in such time interval. In accordance with a further embodiment, a change in velocity within the time interval in which the spatial derivatives of the magnetic field are calculated is provided by an accelerometer. An initial orientation and initial velocity at the start of the time interval in which the spatial derivatives of the magnetic field are calculated may be provided by a sensor fusion filter.

Other features and advantages of the disclosed systems and principles will become apparent from reading the following detailed disclosure in conjunction with the included drawing figures.

DETAILED DESCRIPTION OF THE DISCLOSURE

Preferred embodiments of the present disclosure will be described herein below with reference to the accompanying drawings. In the following description, well-known functions or constructions are not described in detail to avoid obscuring the present disclosure in unnecessary detail. A brief overview of the system of interest will be given before presenting a detailed discussion of the various system components and functions.

In an embodiment of the disclosed principles, instead of simply sending the last known sample from the 3D magnetometer to the AP, starting from the original high rate samples collected within the entire time interval since the last data was sent to the AP, a low rate output sample is computed that gives all the relevant magnetic field information about such time interval. In this way, magnetometer information marginalization is enabled.

Thus, in particular, a 3D magnetometer is sampled at high frequency at the sensor-side. Using the angular velocity from, e.g., a 3D gyroscope (or other means, e.g. vision, odometry, lidar/radar, multitude of accelerometers, etc.), different magnetometer samples collected within a time interval at different times and referenced to different sensor frames, can be rotated to a common time instant. The average magnetic field over the interval can be computed and sent to the AP. This allows a reduction in the magnetometer noise, magnetic interference from other circuitry, and may improve the effective sample resolution. The homogeneity of the magnetic field in each time interval can be evaluated, and a quantitative measure of it can be provided. Further, a subset samples selection scheme may be implemented to eliminate outliers and short term temporal or spatial disturbances and aliasing.

Figure 5:
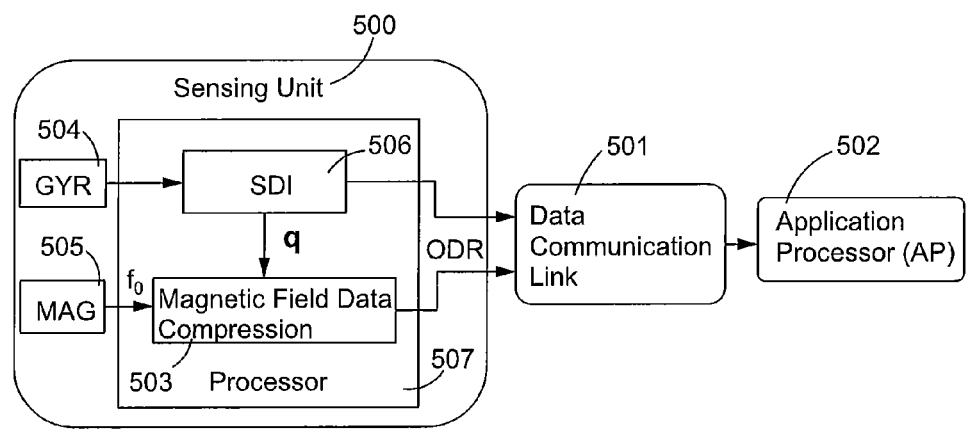
FIG. 5 is a schematic diagram of an architecture where an embodiment of the disclosed principles is implemented in combination with a gyroscope sensor in a Sensing Unit, connected to an Application Processor (AP) through a Data Communication Link.

FIG. 5 shows a schematic diagram of an architecture according to an embodiment. In the figure, a Processor unit 507 is directly connected to at least one gyroscope device 504 and a magnetometer device 505, contained in a Sensing Unit 500. The Sensing Unit is connected through a Data Communication Link 501 to an Application Processor (AP) 502. In such architecture, the magnetometer is sampled at high sample rate $f_0$ providing samples $m_t$ at generic sample time t. Depending on the application and magnetometer specifications, $f_0$ can range from several tens of Hz up to a few kHz. The gyroscope is sampled at the same or different sample times as the magnetometer. The angular velocity samples from the gyroscope are processed by SDI algorithms 506 running on the Processor unit, in order to provide a measure of the change in rotation $q_t$ between corresponding magnetometer samples, as discussed in more detail in the next sections.

The samples $m_t$ and $q_t$ within the entire time interval since the last data was sent to the AP are processed by the Magnetic Field Data Compression block 503, running on the same Processor unit. This block calculates the magnetic field information of interest, as concisely described in the previous paragraph, and detailed more in the following ones. Such information is transmitted at low or variable ODR to the AP through the Data Communication Link, requiring only a fraction of the transmission resources, compared to the original set of magnetometer samples in the considered time interval. The reader can appreciate the relevance of the invention noting that, depending on the specific values of $f_0$, ODR, and on the desired magnetic field information, the data compression gain factor can typically range from a few units up to several hundreds.

The Data Communication Link might for example be represented by a dedicated or shared data bus in case the invention is used in, e.g., a smart-phone or tablet, or by a wireless communication link in case the invention is used in, e.g., a wireless sensor, without intending to limit the scope of application of the invention to these examples only. The Processor unit 507 is typically an ASIC in order to achieve the highest power efficiency, although other solutions (e.g. dedicated MCU) are possible. The reader should appreciate that the described Sensing Unit block 500, in practice, can either contain an integrated gyroscope and magnetometer, possibly in combination with an accelerometer, or may utilize a combination of distinct hardware components. For example, the disclosed embodiment might be implemented in currently available 6DOF packages integrating 3D accelerometers and 3D gyroscopes (typically called inertial combo sensors), to process magnetometer data from an external magnetic sensor directly connected to the Processor unit (e.g. thorough I2C or SPI lines). In this latter case, the disclosed invention can provide means for synchronizing in time the streams of data from magnetometers and gyroscopes, as discussed in more detail in next paragraphs. For this reason, it becomes evident to the reader that the Sensing Unit block as described in FIG. 5 only represents the minimal functional requirements for implementation of an embodiment of the disclosed invention, without intending to limit the scope of the invention to this architecture.

In another embodiment of the invention, the 3D magnetometer is used in combination with a 3D gyroscope and a 3D accelerometer in the Sensing Unit, and with a tracking filter running at the AP side. The partial derivatives of the magnetic field in space can be precisely evaluated (on a stand-alone or on-demand basis) at the Sensing Unit side, from the set of high rate samples collected within the entire time interval since the last data was sent to the AP, together with knowledge of initial orientation and initial velocity of the Sensing Unit in said interval, typically provided by the AP. Such partial derivatives, or a subset of them depending on the specific application requirements, can be transmitted to the AP at the same low ODR.

Other beneficial results that may be achieved include improved robustness in magnetometer based gesture/pattern recognition, by providing means to correct for unwanted displacement caused by relative movements between a tracked object and tracker device.

Having discussed various embodiments in overview, a more detailed discussion of these and other embodiments will be undertaken. In order to provide a measure of the average magnetic field in an interval, a set of high rate magnetometer samples cannot simply be averaged together. Instead, it is necessary in this case to account and compensate for the relative change in rotation between those samples. For the sake of example, consider a magnetometer rotating on the x-y plane at 1000 deg/s (this is common in high dynamic human applications like gaming), and sampled at 100 Hz. The difference in heading between only two contiguous samples would be 10 degrees, resulting in dramatic errors in practical situations.

In an embodiment, the angular velocity as measured from a 3D gyroscope is used in order to rotate different magnetometer samples within a time interval to a common time instant. However, other sensing modalities may be used instead to provide a direct or derivative reading of angular velocity or change in orientation (e.g. vision, image processing, odometry, a multiplicity of accelerometers, radar/lidar, etc., to mention a few).

Figure 1:
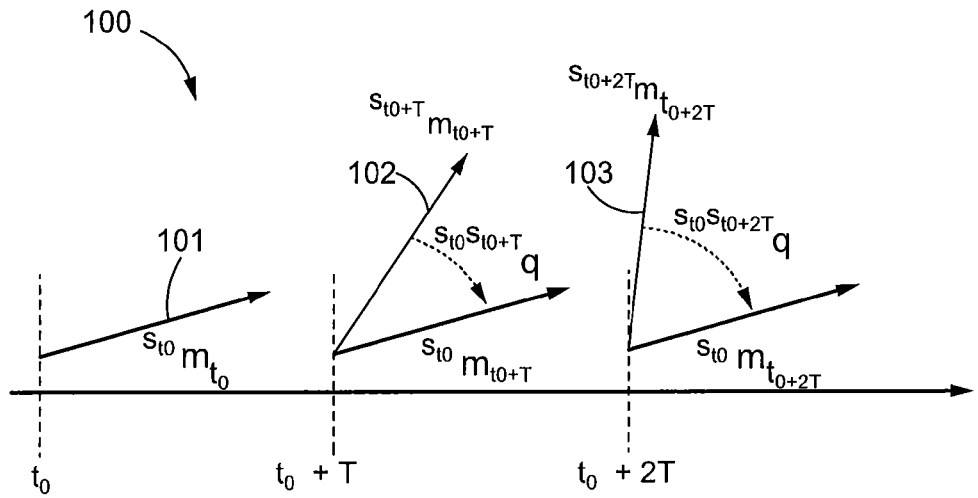
FIG. 1 is a vector data plot showing correction of magnetometer samples for rotation.

FIG. 1 is a vector-time diagram 100 showing magnetometer inter-sample rotation compensation of various samples 101, 102, 103. The magnetometer samples at different time instants are rotated to a common time ($t_0$ in this case), to account for the relative change in sensor frame. With respect to the vectors of FIG. 1, the magnetometer is sampled at a high rate $f_0=1/T$.

The magnetometer sample at time $t_0$ is denoted as $$^{S_{t_0}}m_{t_0},$$

where $S_{t_0}$ defines the sensor frame at time $t_0$. Similarly, the magnetometer sample at time $$t_0 + T \text{ is } {}^{S_{t_0+T}}m_{t_0+T},$$

where $S_{t_0+T}$ defines the sensor frame at time $t_0+T$, etc. (bold symbols denote vectors). The change in orientation between time $t_0$ and time $t_0=T$ is defined with the quaternion $$^{S_{t_0+T}}q.$$

Note that the quaternion formulation is proposed here for the pure sake of example; other formulations (e.g. using rotation matrix) are possible. Using the angular velocity $\omega_{t_0+T}$ measured by the gyroscope at same time $t_0+T$, results in the expression:

$$^{S_{t_0}}{}^{S_{t_0+T}}q = \exp(0.5\omega_{t_0+T}T) \quad (1)$$

In this way, the magnetic field sample at time $t_0+T$ can be expressed in the same sensor frame as corresponding to time $t_0$, by correcting it for the change in rotation occurring within the time interval $[t_0, t_0+T]$; i.e.:

$$^{S_{t_0}}m_{t_0+T} = {}^{S_{t_0}}{}^{S_{t_0+T}}q * {}^{S_{t_0+T}}m_{t_0+T} * {}^{S_{t_0}}{}^{S_{t_0+T}}q^c \quad (2)$$

where $q^c$ denotes the quaternion conjugate of q, and * denotes the quaternion multiplication. This formulation can be generalized to a generic rotation between samples at time $t_0$ and $t_0+nT$ as:

$$^{S_{t_0}}m_{t_0+nT} = {}^{S_{t_0}}{}^{S_{t_0+nT}}q * {}^{S_{t_0+nT}}m_{t_0+nT} * {}^{S_{t_0}}{}^{S_{t_0+nT}}q^c \quad (3)$$

with similar notation as previously introduced, and:

$$^{S_{t_0}}{}^{S_{t_0+nT}}q = {}^{S_{t_0}}{}^{S_{t_0+T}}q * {}^{S_{t_0+T}}{}^{S_{t_0+nT}}q * \ldots * {}^{S_{t_0+(n-1)T}}{}^{S_{t_0+nT}}q$$

defining the sensor rotation between the generic time $t_0$ and $t_0+nT$.

With respect to magnetometers averaging, since the magnetometer samples $$^{S_{t_0}}m_{t_0+nT}$$

are all expressed in a common sensor frame $S_{t_0}$, they can simply be averaged within an overall interval $[t_0, t_0+NT]$ as:

$$^{S_{t_0}}m_{Av(t_0,t_0+(N-1)T)} = \frac{1}{N}\sum_{n=0}^{N-1} {}^{S_{t_0}}m_{t_0+nT} = \frac{1}{N}\sum_{n=0}^{N-1} {}^{S_{t_0}S_{t_0+nT}}q * {}^{S_{t_0+nT}}m_{t_0+nT} * {}^{S_{t_0}S_{t_0+nT}}q^c \quad (4)$$

where N is the number of averaged samples. Such an average can be streamed at the AP side at a much lower rate, and may be used, e.g., for stabilizing the heading of the system much more reliably than a single sample directly collected at low ODR.

Figure 2:
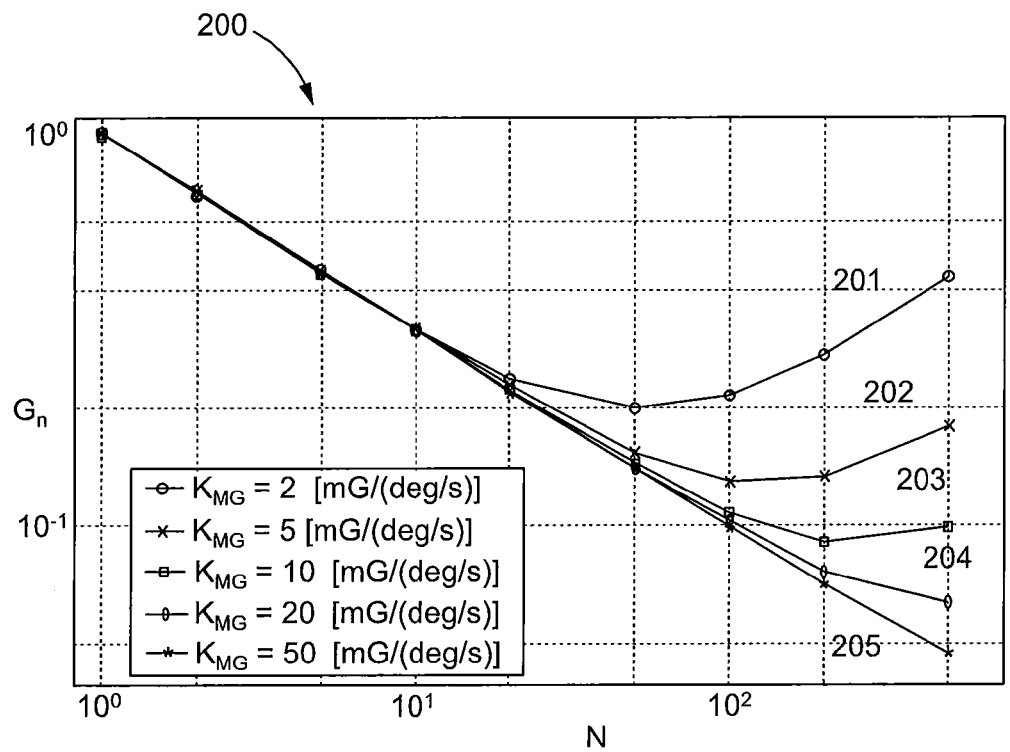
FIG. 2 is a plot showing the noise gain factor achieved with an embodiment of the described principles versus the number of samples.

The magnetometer noise reduction using the above described method can be significant. The theoretical analysis of the improvements in noise performance is complex, however, an example of achievable results is shown in FIG. 2, for 100 Hz magnetometer and gyroscope input rate and a typical Earth magnetic field of 0.5 Gauss. In particular, the data chart 200 of FIG. 2 shows a noise reduction gain factor $G_n$ achieved with the proposed solution, vs. the number of averaged samples N, and for different values 201, 202, 203, 204, 205 of the "magnetometer to gyroscope noise merit figure" $k_{MG}$, further defined in the following. The noise reduction gain factor $G_n$, as used herein refers to the ratio between the standard deviation of the mean of the rotated magnetometer samples and that of the original magnetometer input samples, i.e.:

$$G_n = \frac{std\{^{S_{t_0}}m_{Av(t_0,t_0\rightarrow(N-1)T)}\}}{std\{^{S_{t_0}}m_{t_0}\}} \quad (5)$$

To plot the results, we introduce the "magnetometer to gyroscope noise merit figure", defined as the ratio between the noise densities of magnetometer $n_M$ and gyroscope $n_G$:

$$k_{MG} = \frac{n_M}{n_G}$$

Typical values of noise density for gyroscopes currently available in the market are in the range 0.01 to 0.03 deg/s/√Hz for consumer electronics devices (e.g. INVENSENSE MPU-3050 or ST L3G4200D); they can go down to ~0.005 deg/s/√Hz for automotive (e.g. INVENSENSE MPU-3300, EPSON 8100CB) or optical image stabilization applications. Typical values for magnetometer noise density range from 200 uG/°Hz for consumer grade magnetometers (e.g. HONEYWELL HMC5883L) down to about 50 uG/√Hz. Therefore, the values as in FIG. 2 are indicative for consumer electronics applications. For example, with $n_M$=200 uG/√Hz and $n_G$=0.02 deg/s/√Hz, the result is $k_{MG}$=10 mG/(deg/s).

From the figure, it will be appreciated that the solution described herein is able to provide remarkable improvements, e.g. by approximately a factor 10 for typical values of $k_{MG}$, when compressing the magnetometer samples down to 1 Hz ODR. This is also indication that in practical situations, the contribution of noise from gyroscopes can be safely ignored down to such ODR. Also note that in the limit case in which the noise of the gyroscopes can be neglected, the curve for $G_n$ would exhibit the canonical −0.5 slope, typical of averaging uncorrelated noise, also for high values of N.

In a similar way, the described solution is able to provide comparable improvements with respect to magnetic interference caused by other electronic circuitry in close proximity to the magnetometer. This can be of relevance particularly for consumer electronics devices (e.g. tablets, smart-phones, etc.), given the dense integration in miniature mobile devices of a diversity of systems and components including: GSM, UMTS, LTE, GPS, Bluetooth, WiFi, Near Field Communication (NFC), wireless battery charging circuitry, battery and power management circuitry, sensors, etc. For the sake of example, without limiting the relevance of application to this scenario, consider the case of inductors which are used in consumer electronics circuitry to improve the overall system power efficiency. This is usually crucial in such applications, given the demand for low-power consumption.

However, a significant drawback of inductors is that they typically cause magnetic interference at frequencies corresponding to the occurrence of the major system processing loads. Most of these frequencies are relatively low, ranging from a few Hz to a few hundred Hz. For example, GPS can cause magnetic interference at certain frequencies, as well as corresponding harmonics due to irregular system power loading. Since these frequencies are similar to the bandwidth of motion which needs to be tracked, such interference cannot be simply filtered out with traditional analog or digital filtering techniques, since it is not possible to distinguish it from the actual motion of interest. For this purpose, the proposed magnetometer inter-sample rotation compensation and averaging disclosed in previous paragraphs is able to provide an effective solution to cancel or strongly mitigate such interference without affecting the sensing of unit motion which needs to be tracked.

Regarding magnetometer resolution gain, an additional advantage of the described solution is represented by the possibility of providing higher quantization resolution on the averaged sample, than that simply given by the sensing device itself. This is especially relevant for consumer electronics applications, which usually employ a digital magnetometer with integrated ADC with typically between 8 and 13 bits of resolution. For example, 8 bits for the AKM AK8973, 12 bits for the HONEYWELL HMC5883L or the AICHI STEEL AMI304, 13 bits for the AKM AK8975, etc. Such resolutions may be insufficient depending on the user application.

Assuming magnetometer input noise sufficiently larger than the quantization resolution, as occurs in practice for good ADC design, the averaged sample as in eq. (4) provides a resolution gain in bits of:

$$G_{n,bits} = \log_2 N$$

Thus, for example, N=16 already provides 4 more bits of resolution; given the typical magnetometer ADC specifications previously summarized, this might be highly desired in practical applications. Therefore, the described solution might also be used as a magnetometer oversampling technique to increase its final resolution.

With respect to magnetic field homogeneity, the presence of a magnetic disturbance in the environment can be detrimental for tracking applications, if not properly handled. Therefore, the possibility of early detection of unwanted fields is of interest.

The described solution allows a device to give an accurate indicator of the potential presence of unwanted magnetic disturbance within each single magnetometer ODR sample. In fact, from the set of N rotated magnetometer samples $$^{S_{t_0}}m_{t_0+nT},$$

their standard deviation can be empirically evaluated as:

$$std\{^{S_{t_0}}m_{t_0},\,^{S_{t_0}}m_{t_0+T},\,\ldots\,,\,^{S_{t_0}}m_{t_0+(N-1)T}\} = \sqrt{\frac{1}{N}\sum_{n=0}^{N-1}\left(^{S_{t_0}}m_{t_0+nT} - {}^{S_{t_0}}m_{Av(t_0,t_0+(N-1)T)}\right)^2}$$

Therefore, the empirical standard deviation of the averaged sample $$^{S_{t_0}}m_{Av(t_0,t_0+(N-1)T)}$$

is simply:

$$std\{^{S_{t_0}}m_{Av(t_0,t_0+(N-1)T)}\} = \sqrt{\frac{1}{N(N-1)}\sum_{n=0}^{N-1}\left(^{S_{t_0}}m_{t_0+nT} - {}^{S_{t_0}}m_{Av(t_0,t_0+(N-1)T)}\right)^2} \quad (6)$$

This expression can be evaluated from the high rate samples, and "packed" together with the low rate output sample. At the receiving AP side, this value can be compared with the expected standard deviation, which results from eq. (3) as:

$$std = \{^{S_{t_0}}m_{Av(t_0,t_0+(N-1)T)}\} = G_n std\{^{S_{t_0}}m_{t_0}\}$$

which is known, e.g., from the data-sheet specification of the gyroscope and magnetometer.

If the magnetic field standard deviation in the ODR sample differs significantly from the expected one, the presence of magnetic disturbance is inferred, using such single ODR sample only. Moreover, the solution here described works well within a sensor fusion framework, since the magnetic field homogeneity indicator as in eq. (6), is a quantitative measure of the sample standard deviation, which can be directly used by the fusion algorithm at the AP side. Therefore, no threshold or "hard-decision" needs to be made at the sensor side; the empirical standard deviation is directly used as a measure of the magnetometer field homogeneity.

Figure 3:
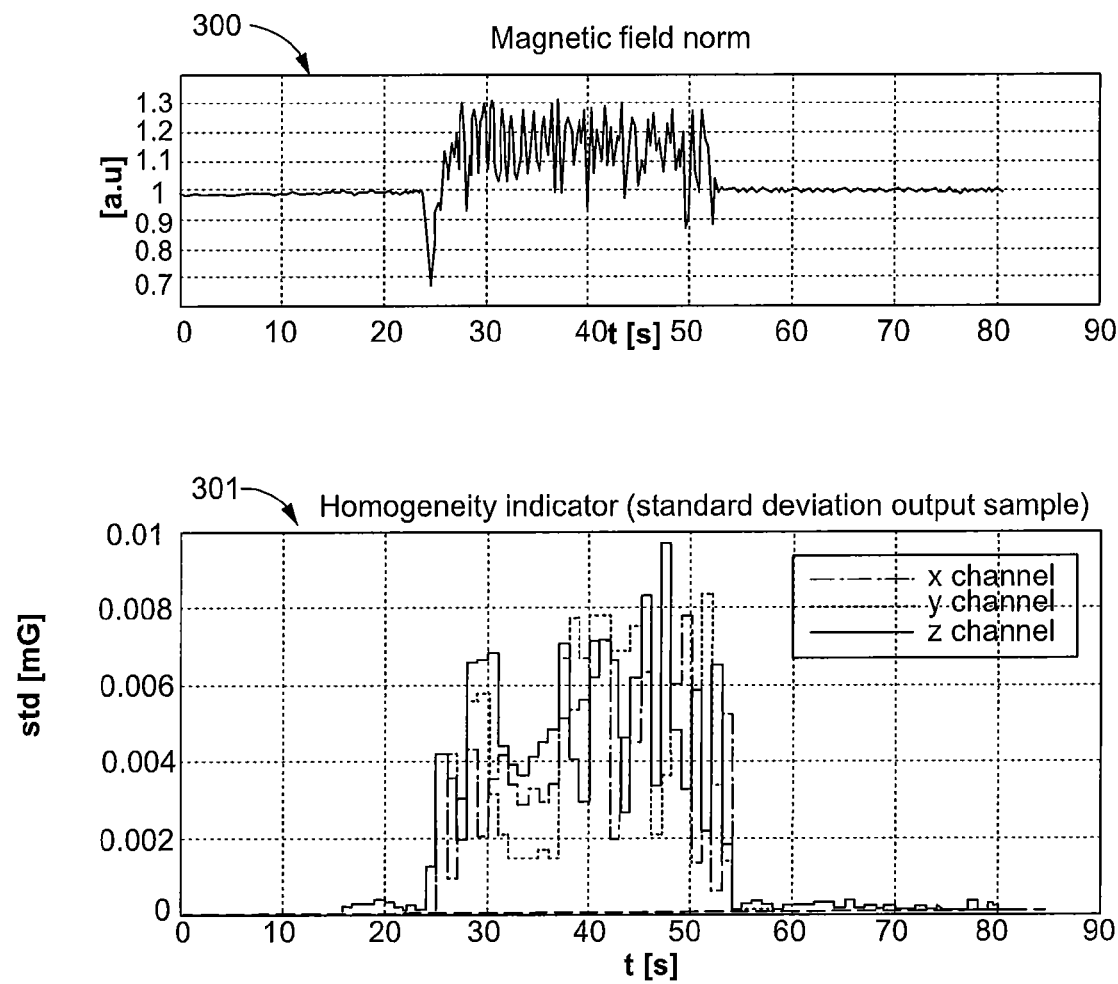
FIG. 3 is a pair of magnetic field plots showing a response to a magnetic field disturbance in keeping with an embodiment of the disclosed principles.

By way of example, FIG. 3 contains a pair of data plots 300, 301 showing the magnetic field homogeneity indicator 301, calculated as in eq. (6), for a dynamic trial containing a magnetic disturbance in its mid portion (as shown in the magnetic field norm plot 300—note that the expected value of the norm would be one (1.0) in case of no-disturbance). The ODR is chosen equal to 1 Hz. It can be seen that in case of no disturbance the expected standard deviation (dashed line) matches very well the empirical one. It is also evident that the proposed solution is able to clearly detect the presence of a magnetic disturbance.

Depending on the specific application, a different strategy rather than the mean evaluation as in (4), can be implemented. In fact, in the case of, e.g., high movement dynamics, fast changing magnetic fields, or very low ODR, the presence of magnetic disturbance or aliasing within only a short portion of the output interval might be possible. The use of a simple mean would be affected by such disturbance, resulting in a less reliable measure. This would be properly detected by means of the homogeneity indicator previously described; however, it would prevent the AP side from fully relying on such a magnetometer sample for a relatively long period (the inverse of the ODR).

On the other hand, since the high-rate magnetometer samples after inter-sample rotation compensation are all expressed in a common sensor frame, a suitable strategy can be implemented to select only a portion, i.e., a subset, of such samples, preventing outliers from degrading the accuracy of the mean estimate.

There are numerous possible subset sample selection schemes. These include (but are certainly not limited to) for example selection of samples within a given interval of variation. Such an interval can be calculated from, e.g., estimated sample variance, expected variance, norm of magnetic field, etc. Alternatively, subset selection may be made via iterative removal (or interpolation) samples techniques using e.g., similar methods as above, maximum difference among contiguous high rate samples (first order derivative approximation), curve fit and residuals evaluation in combination with statistical testing. Possible testing strategy include: Kolmogorov-Smirnov distribution test, kurtosis test, skewness test, etc. to mention a few. As another example, subset selection may proceed by use of a median filter or a combination of a mean and median filter together.

A problem of practical relevance is related to time synchronization of different sensors. This issue is especially important in consumer electronics devices. In fact, in this case it is common to have different streams of sensor data, each sampled independently of the others; such data samples are then accurately time-stamped, using, e.g., a time reference provided by a common low level driver. However, the exact timing between samples may not match, i.e., the data samples are not synchronized. To understand how crucial proper time synchronization is, recall again that only 0.01 seconds between samples can easily cause differences of about 10 degrees in orientation, for typical high dynamic human movements.

However, we can use the magnetometer inter-sample rotation compensation method disclosed herein for timing synchronization of data belonging to different sensors. Also in this case, we consider the practical example of synchronization between magnetometers and gyroscopes; however this should not be seen as a limitation of the invention, which on the contrary can be used for synchronization between a diversity of sensors including, e.g., a camera, image processing, odometry, a multiplicity of accelerometers, etc., to mention a few.

Figure 4:
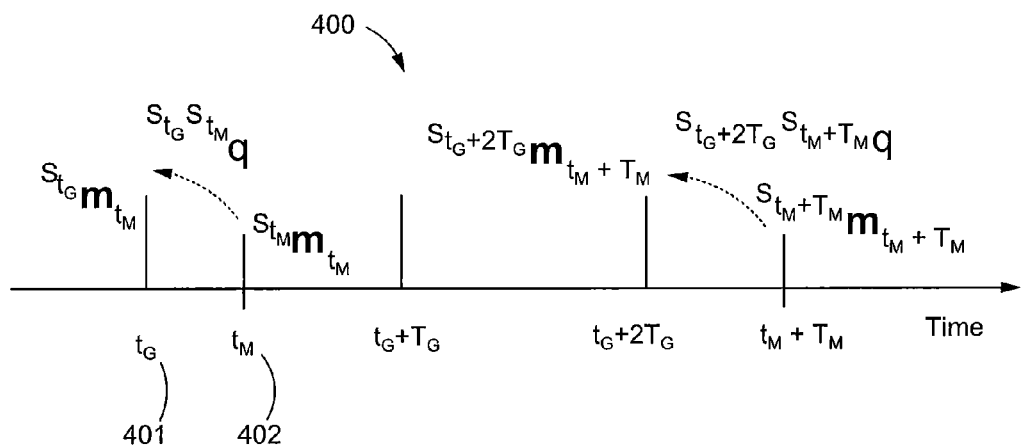
FIG. 4 is a timing sequence plot showing time synchronization using magnetometer inter-sample rotation compensation in accordance with an embodiment of the disclosed principles.

Consider a gyroscope sample $$^{S_{t_G}}\omega_{t_G}$$

at generic time $t_c$, and a magnetometer sample $$^{S_{t_M}}m_{t_M}$$

at generic time $t_M$. $S_{t_G}$ and $S_{t_M}$ represent the sensor frames at times $t_G$ and $t_M$, respectively. The magnetometer sample at time $t_M$ can be synchronized to the same time $t_G$ as the gyroscope sample by rotating the magnetometer sample to $S_{t_G}$. The equation simply results:

$$^{S_{t_G}}m_{t_M} = {^{S_{t_G}}S_{t_M}}q * {^{S_{t_M}}m_{t_M}} * {^{S_{t_G}}S_{t_M}}q^G \qquad (7)$$

where $$^{S_{t_G}S_{t_M}}q$$

is the rotation increment between time $t_M$ and time $t_G$ and can be evaluated from the gyroscope signals, similarly as shown in eq. (2). FIG. 4 shows a diagram of the time synchronization concept here described. In particular, FIG. 4 shows a timing sequence plot 400 showing time synchronization using magnetometer inter-sample rotation compensation.

It should be noted that the proposed scheme relies on an assumption of piecewise constant angular velocity between $t_G$ 401 and $t_M$ 402 for example, since the angular velocity measured by the gyroscope at time $t_G$ 401 is used to rotate the magnetometer sample at time $t_M$ 402. Depending of the movement dynamics and value of $t_G-t_M$, this assumption might introduce some residual errors. In an embodiment, we integrate the previously disclosed strategy with an interpolation scheme, to remove such errors.

Without loss of generality, we can assume that $t_G<t_M<t_G|T_G$, where $T_G$ is the sampling period of the gyroscopes. Note that the sampling rate of gyroscopes might differ from that of the magnetometers (in practical cases the sampling rate of gyroscopes is often higher to provide robustness against coning); this situation is covered as well by the invention. For the sake of example, a simple linear interpolation scheme is shown here; however, more complex solutions can be employed.

We define K such that $t_M t_G=KT_S$, with $T_S$ small enough to provide accurate piecewise constant angular velocity approximation (e.g., for human applications $T_S$ between a few hundred Hz and a few kHz is enough; for industrial applications, $T_S$ should possibly be in excess of a few kHz). The angular velocity from the gyroscope at time $t_G+kT_S$, for $0 \le k < K$, can be interpolated as:

$$^{S_{t_G}+kT_S}\omega_{t_G+kT_S} = {^{S_{t_G}}}\omega_{t_G} \frac{kT_S}{T_c}({^{S_{t_G}+T_G}}\omega_{t_G+T_G} - {^{S_{t_G}}}\omega_{t_G})$$

In this way, the rotation increment around time $t_G+kT_S$ can simply be evaluated as:

$$^{S_{t_G}+kT_S S_{t_G}+(k+1)T_S}q = \exp(0.5 {^{S_{t_G}+kT_S}}\omega_{t_G+kT_S} T_S)$$

and the overall rotation between $t_G$ and $t_M$ as:

$$^{S_{t_G}S_{t_M}}q = {^{S_{t_G}S_{t_G}+T_S}}q * {^{S_{t_G}+T_S S_{t_G}2T_S}}q * \ldots * {^{S_{t_G}+(k-1)T_S S_{t_G}+kT_S}}q$$

Such rotation increment can be used to accurately synchronize the magnetometer sample to the gyroscope sample, using the same expression as in eq. (7). Also note that in this scheme, the magnetometer sample at time $t_M$ is rotated to the start of the gyroscope frame $t_G$ (with $t_G<t_M<t_G+T_G$). This has been chosen for pure notational convenience and consistency with the formulation introduced above. However, it might also be desired to rotate the magnetometer sample to the end of the gyroscope frame (i.e. to: $t_G+T_G$). This solution has the advantage of not introducing additional latency, and in practice it might be preferred.

In many applications, knowledge of the magnetic field partial derivatives in space is of relevance. Possible uses of them include: gradient calculation in magnetic tracking or magnetic based SLAM applications; divergence or curl evaluation as a measure of consistency in similar applications; human motion tracking systems by means of magnetometers, or by means of magnetometers in combination with accelerometers and/or gyroscopes; input for "ad-hoc" spatial magnetic field prediction model in tracking applications; metric for the spatial (and/or temporal) magnetic field variation in the interval; and to provide higher immunity against spatial aliasing.

Solutions proposed in the literature measure the spatial derivatives by means of gradiometers (the interested reader can find an example in, e.g., the following reference: T. Nara, "*A Closed-Form Formula for Magnetic Dipole Localization by Measurement of Its Magnetic Field and Spatial Gradients,*" IEEE Transaction on Magnetics, vol. 42, no. 10, pp. 3291-3293, October 2006). A gradiometer typically comprises a set of magnetometers with low noise characteristics, spaced from each other at suitable distance, to have a simultaneous measure of the magnetic field at different points; in this way, a derivative measure of the magnetic field in space is provided. This approach, however, has the drawback of requiring a dedicated sensor with relatively large size. Especially for general purpose applications or consumer electronics systems, this solution is often not viable. At the same time, it lacks flexibility and poses some fundamental limits on achievable accuracy for fast changing magnetic fields in space (e.g., in near proximity to a dipole source), due to the finite and fixed baseline distance.

An alternative possibility according to an embodiment is to evaluate the partial derivatives from a set of samples in time using a single 3D magnetometer; this is the case addressed here. If there is enough spatial variation in such set of samples, a proper estimate of the magnetic field derivatives in space can be obtained. To this purpose, it should be noted that the partial derivatives do not usually need to be known at high rate at the application side. However, high data rates are usually necessary to accurately calculate them; this is especially true in case of high dynamics or fast changing magnetic fields. Therefore, even when partial derivatives need to be evaluated only at a Hz rate, sample rates ranging from several tens to few hundred Hz are typically necessary with this approach.

In this section, we describe an application of the magnetic field inter-sample rotation compensation to spatial derivatives calculation and packaging. Specifically, we describe a method for calculating magnetic field spatial derivatives at IMU+Mag side, from a set of high rate magnetometer samples collected in dynamic conditions, by means of the inter-sample rotation compensation method previously disclosed. With respect to a further embodiment, the partial derivatives are streamed to the AP side (on stand-alone or on-demand basis) at low ODR.

For the sake of example, we consider the case in which the invention is used in combination with an IMU, without intending to limit the scope of application to this scenario only. Consider the matrix of partial derivatives of the magnetic field in space at time $t_0$ (in Cartesian coordinates for convenience):

$$\frac{\partial^L m_{t_0}}{\partial l} = \begin{bmatrix} \frac{\partial^L m_{t_0 x}}{\partial x} & \frac{\partial^L m_{t_0 x}}{\partial y} & \frac{\partial^L m_{t_0 x}}{\partial z} \\ \frac{\partial^L m_{t_0 y}}{\partial x} & \frac{\partial^L m_{t_0 y}}{\partial y} & \frac{\partial^L m_{t_0 y}}{\partial z} \\ \frac{\partial^L m_{t_0 z}}{\partial x} & \frac{\partial^L m_{t_0 z}}{\partial y} & \frac{\partial^L m_{t_0 z}}{\partial z} \end{bmatrix} \quad (8)$$

where L denotes a fixed, Earth referenced coordinate frame, and consider for analysis a single column, e.g.:

$$\frac{\partial^L m_{t_0}}{\partial x}.$$

With some manipulation:

$$\frac{\partial^L m_{t_0}}{\partial x} = \frac{\partial^L m_{t_0}}{\partial t}\frac{\partial t}{\partial x} = \frac{\partial^L m_{t_0}}{\partial t}\frac{1}{({}^L v_{t_0 x} + d^L v_{t_0 x})} \quad (9)$$

where $${}^L v_{t_n x}$$

is the initial velocity along x at time $t_0$, $$d^L v_{t_n x}$$

is the velocity increment in the considered elementary time interval, and all quantities are expressed in the L frame. Note that $$\frac{\partial^L m_{t_0}}{\partial t}$$

can be calculated as:

$$\frac{\partial^L m_{t_0}}{\partial t} = {}^{LS_{t_0}} q_{t_0} * \frac{\partial^{S_{t_0}} m_{t_0}}{\partial t} * {}^{LS_{t_0}} q_{t_0}^c \quad (10)$$

Therefore the initial rotation between external frame and sensor frame at time $t_0$ needs to be known, in order to evaluate eq. (10) (this point will be further addressed in the following).

$$\frac{\partial^{S_{t_0}} m_{t_0}}{\partial t}$$

is the time derivative of the magnetic field at time $t_0$ in sensor frame $S_{t_0}$. In order to be able to numerically evaluate the time derivative from a set of suitable samples, first such samples need to be expressed in the common sensor frame $S_{t_0}$. For this reason, we propose to use the magnetometer inter-sample rotation compensation disclosed in eq. (2), in order to provide a suitable set of time samples:

$$\{{}^{S_{t_0}} m_{t_0 + nT}\}$$

corrected for the relative change in rotation among them.

At this point, the time derivative can be evaluated with any well-known numerical approximation method applied on such set of samples $$\{{}^{S_{t_0}} m_{t_0 + nT}\}.$$

For the sake of example, we can consider the simple case of first order derivative approximation:

$$\frac{\partial^{S_{t_0}} m_{t_0}}{\partial t} \sim \frac{{}^{S_{t_0}} m_{t_0 + T} - {}^{S_{t_0}} m_{t_0}}{T} = \frac{{}^{S_{t_0} S_{t_0 + T}} q * {}^{S_{t_0 + T}} m_{t_0 + T} * {}^{S_{t_0} S_{t_0 + T}} q^c - {}^{S_{t_0}} m_{t_0}}{T}$$

Note that in practice, higher order zero-lag approximations for $$\frac{\partial^{S_{t_0}} m_{t_0}}{\partial t},$$

or more advanced spectral methods (e.g. the Pseudo-Spectral Time Domain transform (PSTD) might be desired. In all these cases, the use of magnetometer samples $${}^{S_{t_0}} m_{t_0 + nT},$$

properly compensated for relative change in rotation, as formulated in eq. (3), should be used.

The expression for the elementary velocity increment $$d^L v_{t_0 x}$$

in eq. (9) can be directly evaluated from the accelerometer data and initial rotation between external frame and sensor frame at time $t_0$ as:

$$d^L v_{t_0} = {}^{LS_{t_0}} q_{t_0} * d^{S_{t_0}} v_{t_0} * {}^{LS_{t_0}} q_{t_0}^c - {}^L g T$$

The elementary velocity increment at time $t_0$ in sensor frame, $$d^{S_{t_0}} v_{t_0},$$

can be evaluated with well-known SDI methods. In the previous equation, gravity $L_g$ is subtracted to integrate the specific force into velocity in the local frame.

It should be noted that in eq. (9), knowledge of initial velocity $$^L v_{t_0 x}$$

is required. This may be fed back, together with the initial orientation, by the sensor fusion filter. To the purpose, two possible modes of operation, when this solution is used in an IMU+Mag/AP scenario, are discussed in the next sections.

Spatial Derivatives Packaging—Stand-Alone Mode

The first system operation here described is stand-alone mode. In this case, the AP sends back to the IMU+Mag orientation and initial velocity at regular intervals, and the IMU+Mag packs the partial derivatives in the ODR sample only when it observes enough spatial variation in a suitable sub-interval of an output frame duration (i.e. To make the change of magnetic field in space observable). Note that when this is not the case, the AP would be able to calculate itself the derivatives from the low ODR samples (or based on other knowledge, e.g., that the sensor is standing still, etc.). It is worthwhile to mention that, since inertial dead-reckoning is very accurate within short time intervals, the AP feedback rate can be about one Hz or lower.

Spatial Derivatives Packaging—on-Demand Driven Mode

In the on-demand mode, the IMU-Mag packs the spatial derivatives together with other information in the output sample, only when driven by an AP request. In this case, the AP sends, together with the request, also the initial velocity and orientation in the external frame. Note that, depending on the specific implementation details, the IMU-Mag may implement a buffer in order to store a previous samples history, which might be used to calculate with no latency the derivatives. For the sake of example, a typical use-scenario for the on-demand mode might be a SLAM application; in this case, the AP will request for additional data e.g. when it recognizes a new unknown point in the map.

Spatial Derivatives—Minimum and Redundant Dataset

It should be noted that not all the entries in the derivatives matrix in eq. (8) are independent. In fact, the magnetic field needs to obey to the well-known Maxwell equations for divergence and curl, which in the differential form results respectively in (for static or quasi-static fields):

$$\nabla \cdot m = 0$$

$$\nabla \times m = \mu_0 I$$

Where the last value equals zero due to magnetometer physical placement constraints (no local currents I). Such equations result in the following relationships:

$$\frac{\partial m_{tx}}{\partial x} + \frac{\partial m_{ty}}{\partial y} + \frac{\partial m_{tz}}{\partial z} = 0$$

-continued $$\frac{\partial m_{tz}}{\partial y} - \frac{\partial m_{ty}}{\partial z} = 0$$

$$\frac{\partial m_{tx}}{\partial z} - \frac{\partial m_{tz}}{\partial x} = 0$$

$$\frac{\partial m_{tz}}{\partial y} - \frac{\partial m_{ty}}{\partial z} = 0$$

Therefore, only 5 entries of the derivatives matrix need to be streamed in order to have full knowledge of it. At the same time, some applications might be interested in only a few terms, (e.g., only the diagonal ones). Therefore, depending on the specific application, the IMU-Mag might either stream the full set of derivatives as a redundant measure, the minimum required set, or a portion of it. In this way, only a very limited amount of additional data would need to be streamed, "ad-hoc" fitting the specific application demands.

An application of the invention here described is to enable robust gesture and pattern recognition by means of magnetic field tracking. In such applications, a permanent magnet worn by the user (e.g. in the form of a ring) is tracked by a 3D magnetometer (as e.g. often integrated in smart phones). However, in this scenario, it is fundamental to compensate for possible relative displacement between magnetometer and tracked magnet, other than that caused by the gesture which needs to be identified. Note that such displacement can occur at relatively high-frequency (about 10-20 Hz).

In most use-cases, compensation for only rotational changes might be enough (this is rather similar to the well-known case of optical image stabilization). This can simply be achieved by means of the magnetometer inter-sample rotation compensation solution described in eq. (3). In this way, a set of high rate samples in a common sensor frame (i.e. corrected for the displacement introduced by the moving magnetometer) can be either streamed at such high rate, or properly averaged, filtered or decimated for further processing at the AP side, where the pattern recognition can be correctly performed on samples referred to a consistent frame.

In the event that compensation for linear displacements is required as well, knowledge of initial orientation (and possibly velocity) is required. This case reduces to a formulation similar to that addressed in the previous section, and is omitted for conciseness.

It will be appreciated that the present disclosure provides a system and method for minimizing the data requirement to transmit external magnetic field information in a Sensing Unit/AP pair and other contexts. While only certain embodiments have been set forth, alternatives and modifications will be apparent from the above description to those of skill in the art. These and other alternatives are considered equivalents and within the spirit and scope of this disclosure and the appended claims.

What is claimed is:

1. A method for calculating values based on magnetic field information from a magnetic sensor in a sensing unit containing the magnetic sensor and at least one other sensing modality capable of providing a direct or derivative measure of change in orientation, the method comprising:
   sampling a magnetic field via the magnetic sensor at a plurality of points in time at a sample rate;
   sampling the at least one other sensing modality capable of providing a direct or derivative measure of change in orientation of the sensor unit at each of the plurality of points in time;

rotating to a common time instant one or more of the plurality of magnetic field samples collected within a time interval using the orientation of the sensing unit at each of the plurality of points in time, estimated by means of the other sensing modality, in order to eliminate variations between magnetic samples due to changes in orientation of the sensor unit within such time interval;

using the magnetic samples corrected for the sensor rotation in such interval to calculate magnetic field related information specific to the given time interval; and communicating to a receiver the magnetic field related information at an average rate lower than the sample rate.

2. The method according to claim 1 wherein the other sensing modality is a gyroscope device.

3. The method according to claim 1 wherein the magnetic field related information is represented by one of an average of the magnetic samples in the time interval and an average of a subset of said magnetic samples.

4. The method according to claim 1 wherein the magnetic field related information is represented by a measure of the homogeneity of the magnetic field in the time interval, calculated from the variation of the magnetic samples in such time interval.

5. The method according to claim 1 wherein the magnetic field related information is represented by a subset of the magnetic samples in such time interval.

6. The method according to claim 1 wherein the magnetometer sensor and the other sensing modality are sampled at disjoint and accurately time-stamped set of points in time, and a change in rotation estimated from the other sensing modality is used to synchronize the magnetometer samples to the same time points as the other sensing modality.

7. A method for calculating values based on magnetic field information from a magnetic sensor in a sensing unit containing the magnetic sensor and at least one other sensing modality capable of providing a direct or derivative measure of change in orientation, the method comprising:

sampling a magnetic field via the magnetic sensor at a plurality of points in time at a sample rate;

sampling the at least one other sensing modality capable of providing a direct or derivative measure of change in orientation of the sensor unit at each of the plurality of points in time;

rotating to a common time instant one or more of the plurality of magnetic field samples collected within a time interval using the orientation of the sensing unit at each of the plurality of points in time, estimated by means of the other sensing modality, in order to eliminate variations between magnetic samples due to changes in orientation of the sensor unit within such time interval;

providing a measure of the sensing unit velocity at each of the plurality of points in time;

using the magnetic samples corrected for the sensor rotation in such interval and the sensing unit velocity at each of the plurality of points in time, to calculate magnetic field related information specific to the given time interval; and communicating to a receiver the magnetic field related information at an average rate lower than the sample rate.

8. The method according to claim 7 wherein the magnetic field related information is represented by the spatial derivatives of the magnetic field in the time interval.

9. The method according to claim 7 wherein the other sensing modality is a gyroscope device.

10. The method according to claim 7 wherein the sensing unit velocity at each of the plurality of points in time is calculated from knowledge of the sensing unit orientation and velocity at start of said time interval and from a measure of change of velocity of the sensing unit between the start of the time interval and said plurality of points in time.

11. The method according to claim 10 wherein the change of velocity of the sensing unit between said start of the time interval and each of the plurality of points in time is provided by an accelerometer device contained in the sensing unit.

12. The method according to claim 10, wherein the sensing unit orientation and velocity at the start of the time interval in which the spatial derivatives of the magnetic field are calculated is provided by a sensor fusion filter.

* * * * *